(12) United States Patent
Shih et al.

(10) Patent No.: US 7,824,991 B2
(45) Date of Patent: Nov. 2, 2010

(54) METHOD FOR NITRIDATION OF THE INTERFACE BETWEEN A DIELECTRIC AND A SUBSTRATE IN A MOS DEVICE

(75) Inventors: Yen-Hao Shih, Taipei (TW); Shih-Chin Lee, Yunlin (TW)

(73) Assignee: Macronix International Co., Ltd. (TW)

( * ) Notice: Subject to any disclaimer, the term of this patent is extended or adjusted under 35 U.S.C. 154(b) by 374 days.

(21) Appl. No.: 11/334,249

(22) Filed: Jan. 18, 2006

(65) Prior Publication Data
US 2007/0166923 A1 Jul. 19, 2007

(51) Int. Cl.
H01L 21/336 (2006.01)
H01L 21/31 (2006.01)
(52) U.S. Cl. ........................ 438/287; 438/288; 438/786; 438/788; 438/791; 438/954; 257/E21.192; 257/E21.679
(58) Field of Classification Search ................. 438/264, 438/257–267, 288, 769–770, 773, 775, 786, 438/954, 287, FOR. 431; 257/E21.192, E21.209, 257/E21.662, E21.663, E21.679, E27.104
See application file for complete search history.

(56) References Cited

U.S. PATENT DOCUMENTS

| | | | | |
|---|---|---|---|---|
| 4,839,704 | A * | 6/1989 | Mohammadi et al. | 257/345 |
| 5,923,983 | A * | 7/1999 | Fulford et al. | 438/287 |
| 6,248,628 | B1 * | 6/2001 | Halliyal et al. | 438/257 |
| 6,835,634 | B1 * | 12/2004 | Fazan et al. | 438/452 |
| 6,958,511 | B1 * | 10/2005 | Halliyal et al. | 257/314 |
| 2001/0013618 | A1 * | 8/2001 | Oashi et al. | 257/306 |
| 2004/0043638 | A1 * | 3/2004 | Nansei et al. | 438/792 |
| 2005/0062098 | A1 * | 3/2005 | Mahajani et al. | 257/324 |
| 2005/0266637 | A1 * | 12/2005 | Wang | 438/257 |
| 2006/0017092 | A1 * | 1/2006 | Dong et al. | 257/314 |
| 2007/0048959 | A1 * | 3/2007 | Dietz et al. | 438/372 |

FOREIGN PATENT DOCUMENTS

TW 1235458 7/2003

OTHER PUBLICATIONS

Tseng, et al., Ultra-Thin Decoupled Plasma Nitridation (DPN) Oxynitride Gate Dielectric for 80-nm Advanced Technology, IEEE Electron Device Letters, vol. 23, No. 12, Dec. 2002, pp. 704-706.
Hwang, et al., Electrical and Reliability Characteristics of Ultrathin Oxynitride Gate Dielectric Prepared by Rapid Thermal Processing in N2O, IEEE Electron Device Letters, 1990, pp. 421-424.
Naiman, et al., Properties of Thin Oxynitride Gate Dielectrics Produced by Thermal Nitridation of Silicon Dioxide, IEEE Electron Device Letters, 1980, pp. 5562-564.

* cited by examiner

Primary Examiner—Khiem D Nguyen
Assistant Examiner—Kevin Parendo
(74) Attorney, Agent, or Firm—Baker & McKenzie LLP

(57) ABSTRACT

A MOSFET fabrication process comprises nitridation of the dielectric silicon interface so that silicon-dangling bonds are connected with nitrogen atoms creating silicon—nitrogen bonds, which are stronger than silicon-hydrogen bonds. A tunnel dielectric is formed on the substrate. A nitride layer is then formed over the tunnel dielectric layer. The top of the nitride layer is then converted to an oxide and the interface between the substrate and the tunnel dielectric is nitrided simultaneously with conversion of the nitride layer to oxide.

14 Claims, 7 Drawing Sheets

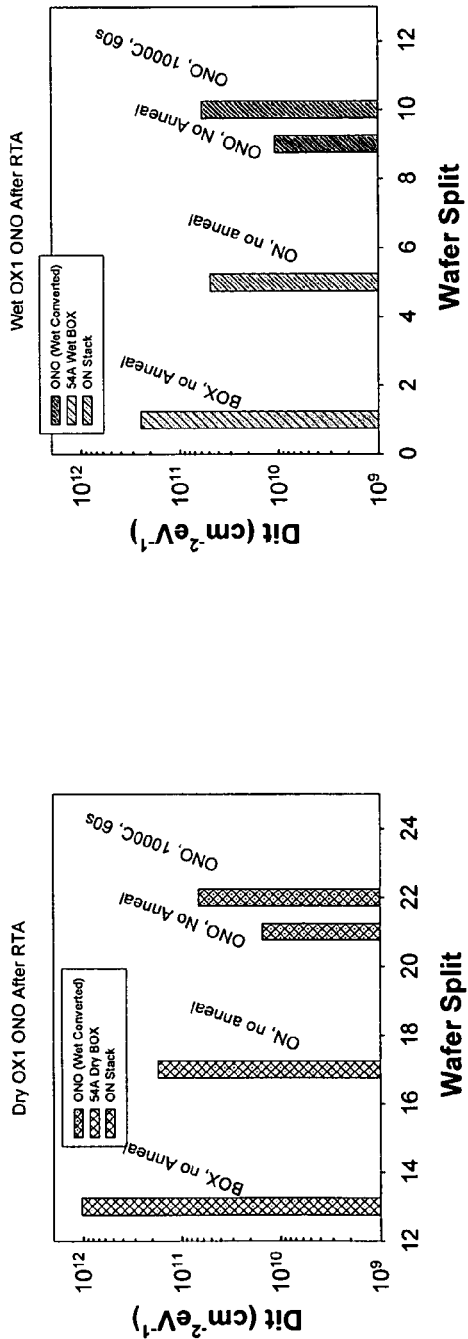
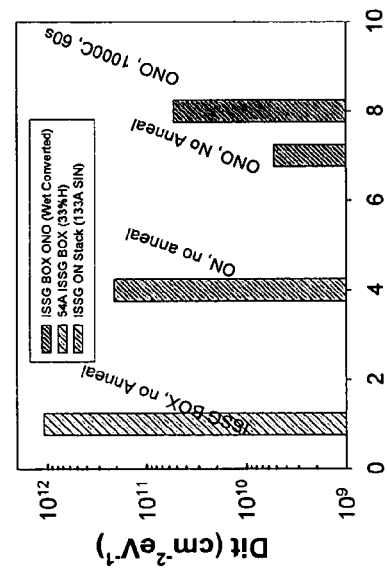
FIG. 4A
FIG. 4B
FIG. 4C

US 7,824,991 B2

METHOD FOR NITRIDATION OF THE INTERFACE BETWEEN A DIELECTRIC AND A SUBSTRATE IN A MOS DEVICE

BACKGROUND

1. Field of the Invention

The embodiments described below are directed to methods for fabricating MOSFET semiconductor devices, and more particularly to methods for prolonging MOSFET device lifetimes.

2. Background of the Invention

As is well understood, a MOSFET device is formed over a silicon substrate layer. The silicon substrate layer can be a P-type silicon layer or an N-type silicon layer; however, for illustration, P-type silicon substrates are addressed here. A drain and source region are then implanted in the substrate. The drain and source region are silicon regions that are doped to be of the opposite type as the substrate. For example, where a P-type silicon substrate is used, N-type drain and source regions can be implanted therein. A charge trapping stack can then be formed over the substrate between the drain and source regions, and a gate electrode is formed over the charged trapping stack.

The charged trapping stack typically comprises a dielectric layer formed over the substrate, a charged storage layer formed on the dielectric, and another dielectric layer formed over the charge storage layer. Charge can be stored in the charge storage layer by applying the appropriate voltages to the gate electrode, drain, source, and substrate. With the proper voltages, electrons will be induced to flow in the substrate between the drain and source regions. A certain number of the electrons will penetrate through the bottom dielectric layer and into the charged storage layer where they will be trapped. The bottom dielectric layer is sometimes referred to as a tunnel dielectric layer.

Unfortunately, the interface between the substrate and the bottom dielectric in a conventional MOSFET device often comprises silicon dangling bonds that are passivated by hydrogen after conventional processes. The silicon-hydrogen bonds are weak and can easily be broken by hot carrier stressing, i.e., the high energy carriers can cause Si—H bond breaking at the silicon-dielectric interface.

The breaking of the silicon-hydrogen bonds can reduce performance over time, and therefore reduce the lifetime of the device. Increased lifetime for MOSFET devices is clearly important and as a result, the reduced lifetime produced by the silicon-hydrogen bonds referred to above is clearly a disadvantage.

SUMMARY

A MOSFET fabrication process comprises nitridation of the silicon-dielectric interface so that silicon-dangling bonds are connected with nitrogen atoms creating silicon—nitrogen bonds, which are stronger than silicon-hydrogen bonds.

In one aspect, a tunnel dielectric is formed on the substrate. A nitride layer is then formed over the tunnel dielectric layer. The top of the nitride layer is then converted to an oxide by wet oxidation (H2O). The interface between the substrate and the tunnel dielectric is nitrided simultaneously with conversion of the nitride layer.

In one aspect, a thermal process can be used to convert the top surface of the nitride layer into an oxide layer.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIGS. 4*a*-4*c* are diagrams illustrating Dit measurements for MOSFET devices that use various methods to grow the dielectric layer over the substrate;

DETAILED DESCRIPTION OF THE PREFERRED EMBODIMENTS

In the embodiments described below, strong silicon-nitride bonds are formed at the interface between the substrate and the tunnel dielectric, which greatly reduces the number of weak silicon-hydrogen bonds in the interface between the substrate and the tunnel dielectric. The increased number of silicon—nitrogen bonds, and decreased number of silicon-hydrogen bonds, strengthens the interface between the substrate and the tunnel dielectric, which increases immunity to hot carrier stressing and increases the lifetime of MOSFET devices fabricated using the embodiments described below.

Figure 1:
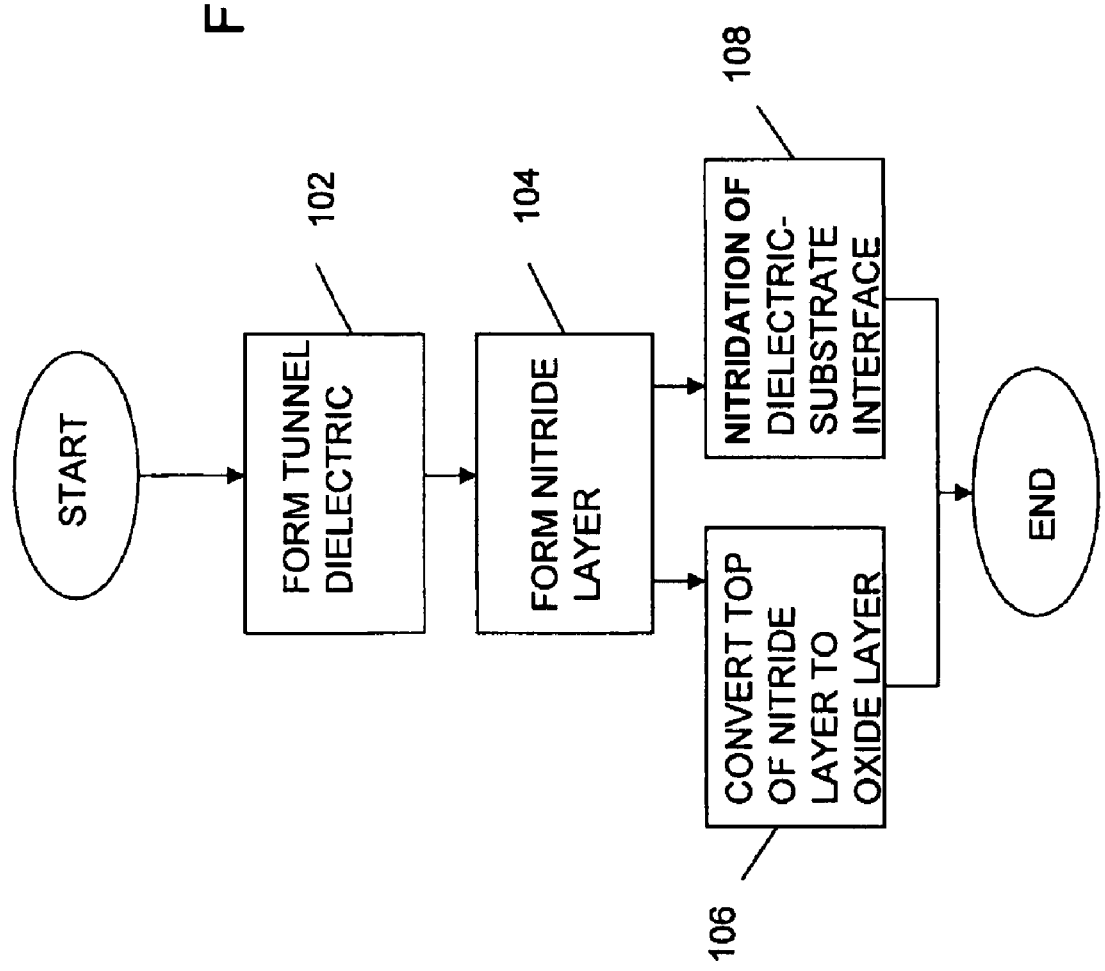
FIG. 1 is a diagram illustrating an example process for forming a MOSFET device in accordance with one embodiment.

FIG. 1 is a diagram illustrating an example method for fabricating a MOSFET device in accordance with one embodiment of the methods described herein. It is assumed that the source and drain regions have been formed in the substrate. In step 102, the tunnel dielectric layer can be formed over the substrate between the source and drain regions. In step 104, a nitride layer can be formed over the tunnel dielectric layer. In step 106, the top of the nitride layer is converted into an oxide layer, and in step 108, the interface between a tunnel dielectric and the substrate is nitrided. As can be seen, steps 106 and 108 can be performed simultaneously.

By nitriding the interface between the silicon and the tunnel dielectric, silicon-dangling bonds are connected with nitrogen atoms, creating stronger silicon-nitride bonds. These stronger silicon-nitride bonds strengthen the interface between the substrate and tunnel dielectric in order to increase immunity to hot carrier stressing.

It should be noted that the tunnel dielectric layer can be either pure silicon oxide ($SiO_2$) or any other high-K material such as $HfO_2$, $ZrO_2$ and $Al_2O_3$. Further, a high-K silicate, such as $HfSiO_2$, or $ZrSiO_2$, can also be used. For various reasons, pure $SiO_2$ can be preferable, and is generally preferred in the semiconductor industry at present.

As will be discussed below, the trapping layer for a MOSFET device fabricated using the methods described herein can comprise various structures. For example, the charged trapping layer can comprise a dielectric layer and a charged storage layer, such as an oxide-nitride (ON) structure, or a dielectric, charged storage layer, dielectric structure, such as a oxide-nitride-oxide (ONO) structure. As such, the embodiments described herein should not be seen as limiting the structure of the MOSFET device or the charged trapping layer in any way.

Figure 2:
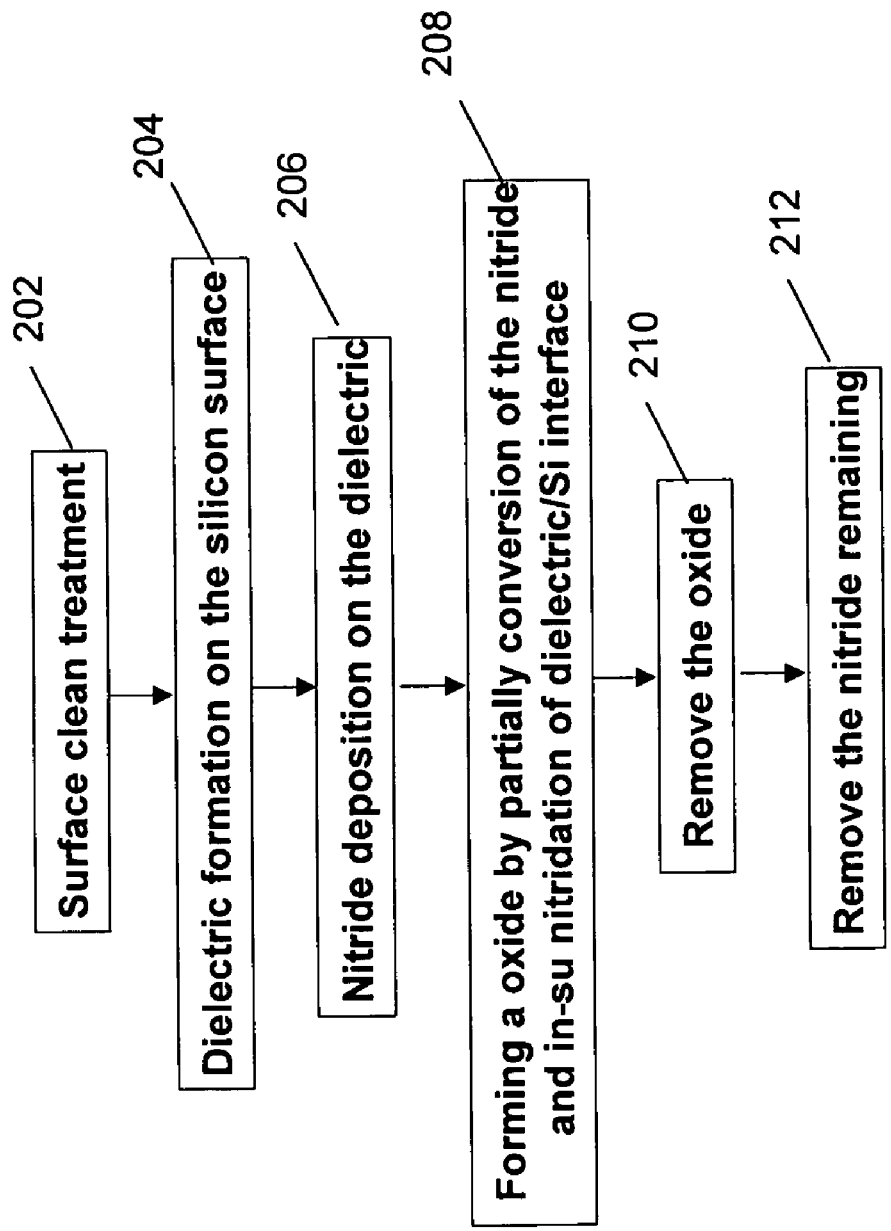
FIG. 2 is a diagram illustrating a more detailed example process for forming a MOSFET device in accordance with another embodiment.

FIG. 2 is a diagram illustrating a more detailed implementation of the process of FIG. 1. In step 202, a surface clean treatment process is applied to the silicon substrate. Surface clean treatment processes are well known and will not be discussed here for the sake of brevity. In step 204, a tunnel dielectric layer is formed on the silicon surface. As mentioned, the tunnel dielectric layer can be pure $SiO_2$, a high-K material, or a high-K silicate. In step 206, a nitride layer is deposited on top of the tunnel dielectric layer. For example, a silicon nitride (SiN) layer can be formed, in step 206, on top of the tunnel dielectric layer formed in step 204.

The nitride layer formed on top of the tunnel dielectric should have a thickness of greater than 30 angstroms, and in certain embodiments, the thickness of the nitride layer can be greater than 100 angstroms. In fact, thicknesses of greater than 100 angstroms can be preferred for many embodiments. In one specific implementation, a nitride layer comprising a thickness of approximately 133 angstroms is formed in step 206 on top of the tunnel dielectric layer formed in step 204.

In step 208, a top portion of the nitride layer deposited in step 206 is converted to an oxide layer and in-su nitridation of the interface between the dielectric and the substrate is performed simultaneously. As mentioned, conversion of a nitride layer can be performed using a thermo process such as steam oxidation, e.g., using a furnace. The temperature used in the furnace should be greater than 950° C., and in one specific implementation, a temperature of approximately 1,000° C. is used to perform the conversion.

The thickness of the oxide layer formed from conversion of the upper layer of the nitride layer should be greater than 20 angstroms. Depending on the embodiment, a thickness of greater than 78 angstroms can be preferable, and in one specific embodiment, for example, a thickness of approximately 90 angstroms is achieved.

In step 210, the oxide layer formed in step 208 is removed and in step 212, the nitride layer formed in step 206 is removed. At this point, a dielectric layer with a nitrided interface should be achieved.

It will be understood, that after removal of the silicon nitride layer, the thickness of the dielectric layer will be reduced by some degree. Preferably, the reduction of thickness of the dielectric layer will be limited. This can be achieved by the selection of the material used to remove the nitride layer. For example, diluted HF has been shown to provide excellent oxide/nitride etching selectivity, e.g., greater than 10:1. Hot phosphoric acid also shows excellent nitride/oxide etching selectivity, e.g., greater than 50:1

Figure 3:
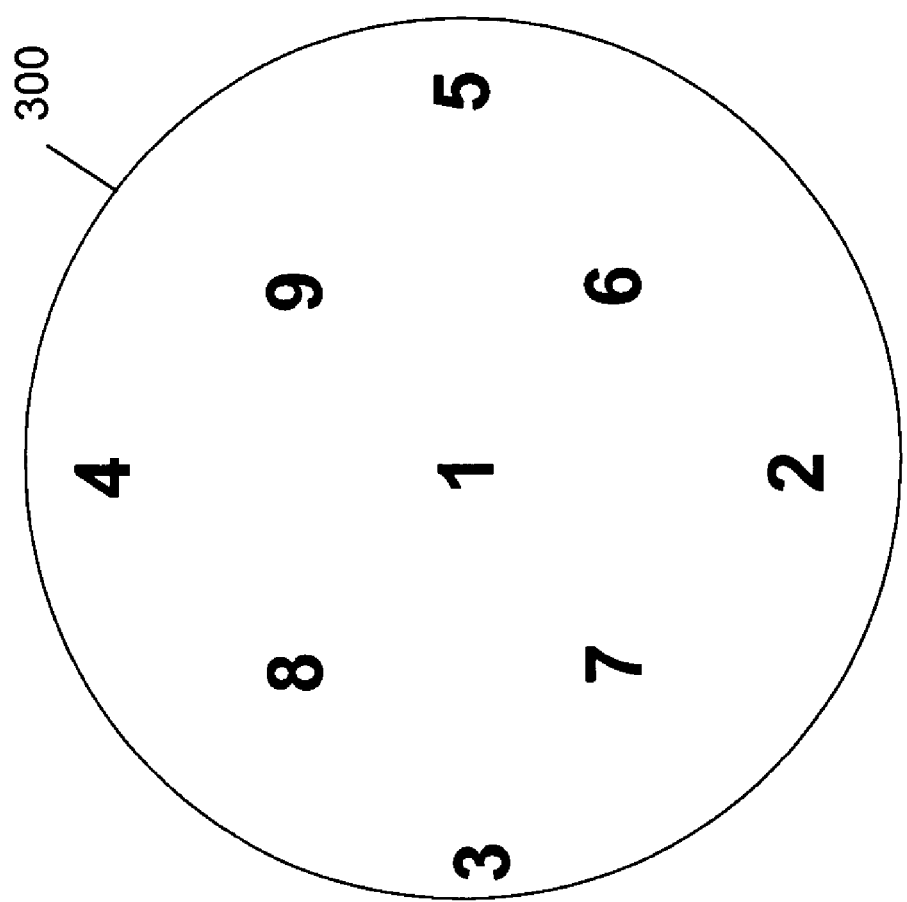
FIG. 3 is a diagram illustrating various identified test sites on a silicon wafer that has undergone a process of FIG. 1 or 2.

FIG. 3 and table 1 illustrate that when a material is selected that provides a selectivity of greater than 50:1, the loss of dielectric after the nitride removal can be less than 2 angstroms. FIG. 3 is a diagram illustrating a test wafer 300 with various test sites 1-9. The process steps 202 through 212 were performed on each site, and as illustrated in table 1, the thickness of the oxide layer at each site was reduced by less than 2 angstroms after the removal of the nitride layer.

TABLE 1

|  | As grown (A) | After SiN removal (A) |
|---|---|---|
| Site 1 | 54 | 53 |
| Site 2 | 55 | 53 |
| Site 3 | 54 | 52 |
| Site 4 | 55 | 53 |
| Site 5 | 54 | 52 |
| Site 6 | 55 | 53 |
| Site 7 | 55 | 53 |
| Site 8 | 55 | 53 |
| Site 9 | 54 | 53 |

As noted above, various trapping layer structure can be used in accordance with the methods described herein. Further, various processes for growing the tunnel dielectric layer can also be used with the various types of trapping layers; however, use of these various processes for growing the dielectric layer should not affect the results achieved using the processes of FIGS. 1 and/or 2. For example, FIGS. 4A through 4C illustrate interface trap density (Dit) measurements for various types of trapping layer structures and for different processes of growing the dielectric layer. In FIG. 4A, a dry oxidation process for growing the dielectric layer was used for the various trapping layer structures, in FIG. 4B, a wet oxidation process was used for growing the dielectric layer and the various trapping layers, and in FIG. 4C, an ISSG process was used for growing the dielectric layer.

After the dielectric layers were grown using the various processes, a nitride layer was deposited on top of the dielectric layer, and the steam oxidation process in step 208 was performed. The Dit measurements of FIGS. 4A to 4C were then obtained after the steam oxidation process. The results of the Dit measurements illustrate that the trapped charge for the interface between the dielectric and the substrate are similar for each trapping layer type and regardless of what type of process was used to grow the dielectric layer.

Figure 5:
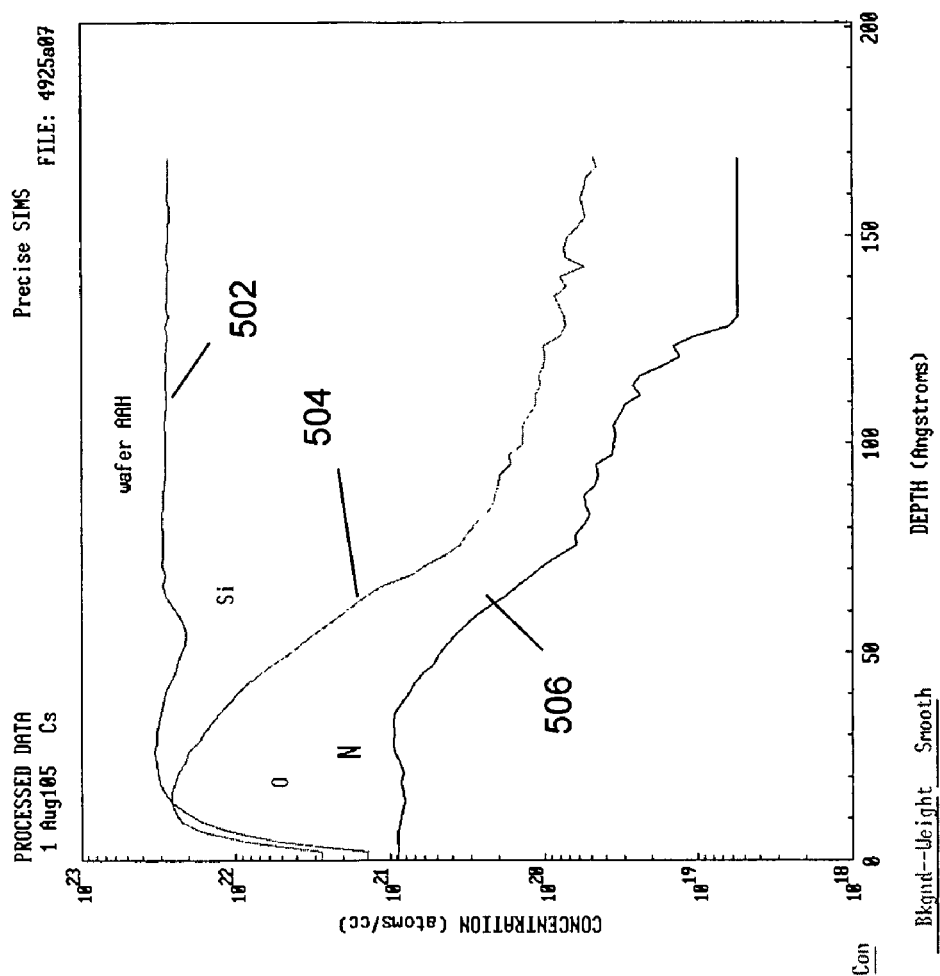
FIG. 5 is a diagram illustrating the concentration of silicon, oxide, and nitride, in the dielectric substrate interface of a MOSFET device formed using the processes of FIG. 1 or 2.

Nitridation of the interface between the dielectric and a substrate can occur during a wet conversion process. FIG. 5 illustrates that about 2% atomic concentration of nitrogen, as illustrated by curve 506, can be found in the interface between the dielectric and the substrate. In FIG. 5, the dielectric is represented by curve 504 and the substrate is represented by curve 502.

Figure 6:
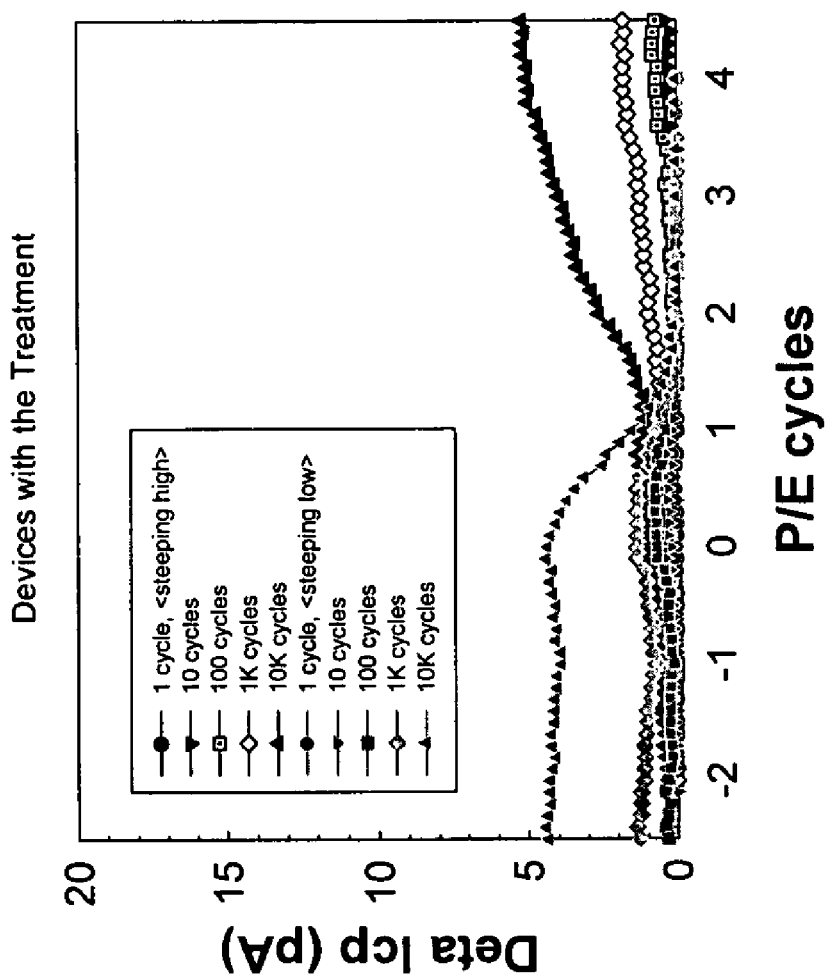
FIG. 6 is a diagram illustrating the charge pumping current (Icp) for devices formed using the processes of FIG. 1 or FIG. 2.
Figure 7:
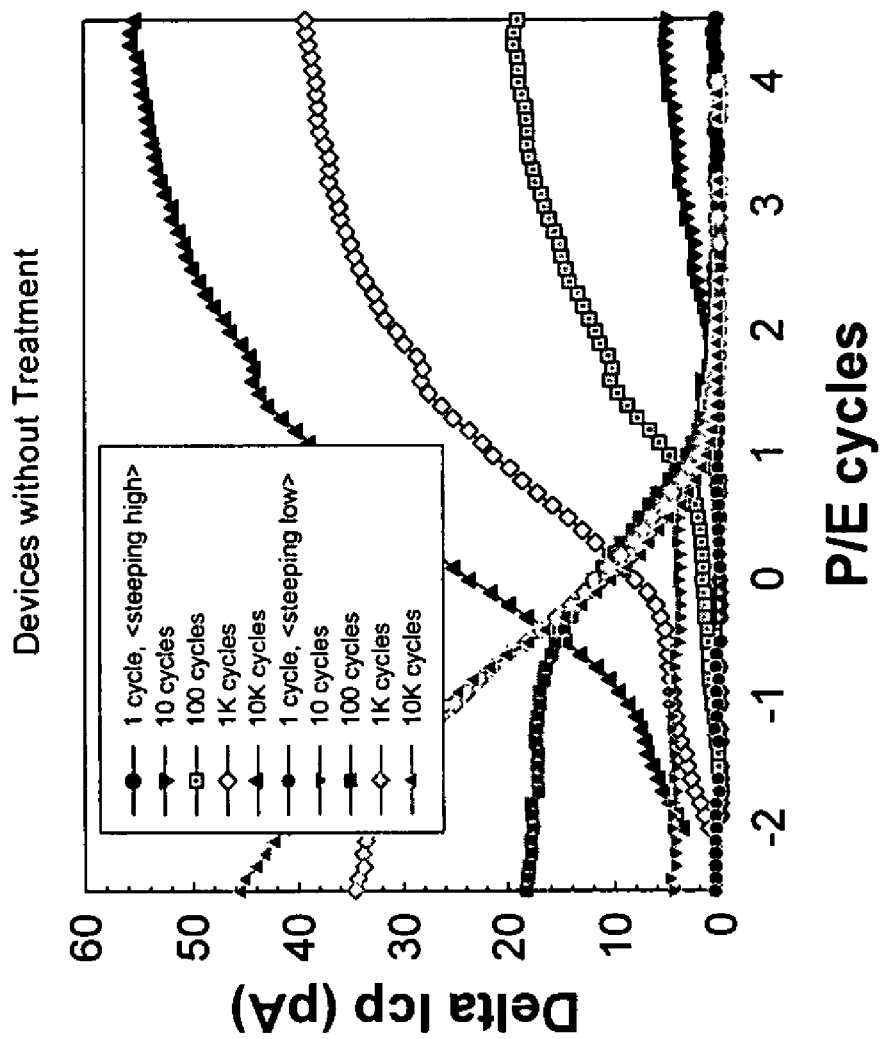
FIG. 7 is a diagram illustrating the charge pumping (Icp) for MOSFET devices formed using conventional processing techniques.

As can be seen in FIGS. 6 and 7, devices that undergo a wet conversion process, e.g., of FIG. 2, have a similar initial charge pumping current (Icp) and much smaller Δ Icp, when compared to devices that do not undergo the process of FIG. 2. FIG. 6 is a graph illustrating the Δ Icp in picoamps for a various number of cycles. As can be the Δ Icp for the various curves is very small.

Conversely, FIG. 7 illustrates the Icp curves for devices that have not undergone the treatment in FIG. 2. As can be seen, the Δ Icp can be as high as 45 Pico amps after P/E cycling.

Accordingly, by nitriding the interface between the dielectric and the substrate, e.g., using a process that illustrated FIG. 2, weak silicon-hydrogen bonds can be replaced with stronger silicon nitride bonds that strengthen the interface between the dielectric and the substrate and increase the lifetime of MOSFET devices fabricated using the process of FIG. 2. In particular, rapid thermal processing, e.g., at a temperature of approximately 1000° C., can break the weak silicon-hydrogen bond and restore the properties of the interface between the dielectric and the substrate.

The methods described above can be used for many different types of memory devices, such as Mask ROM, Flash, EPROM, DRAM, FeRAM, and MRAM. In addition, the methods described above can be used for Microprocessor devices, chipsets, controllers, and other CMOS devices. The methods described above can also be applied general MOSFET devices such as logic transistors.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A process for fabricating a semiconductor device, comprising:
    forming a tunnel dielectric layer over a silicon substrate;
    forming a nitride layer over the tunnel dielectric layer;
    performing a thermal process to convert a top surface of the nitride layer into an oxide layer, said thermal process concurrently nitriding an interface between the tunnel dielectric layer and the silicon substrate by releasing nitrogen atoms from the nitride layer and diffusing said nitrogen atoms into a tunnel dielectric layer/silicon substrate interface to form Si—N bonds; and
    removing the oxide layer and the nitride layer, whereby a thickness of the tunnel dielectric layer is reduced by some degree.

2. The method of claim 1, wherein the thermal process comprises a steam oxidation process performed in a furnace.

3. The method of claim 2, wherein the steam oxidation process uses a temperature of greater than 950° C.

4. The method of claim 1, wherein the nitride layer is formed by depositing a silicon nitride layer on the dielectric layer.

5. The method of claim 4, wherein the deposited silicon nitride layer comprises a thickness of greater than 30 Angstroms.

6. The method of claim 4, wherein the silicon nitride layer comprises a thickness of greater than 100 Angstroms.

7. The method of claim 1, wherein a thickness of the oxide layer is greater than 20 Angstroms.

8. The method of claim 1, wherein a thickness of the oxide layer is greater than 70 Angstroms.

9. The method of claim 1, further comprising selecting a material for removing the nitride layer that comprises an oxide/nitride etching selectivity of greater than 50:1.

10. The method of claim 1, further comprising selecting a material for removal of the nitride layer that comprises an oxide/nitride etching selectivity of greater than a 10:1.

11. The method of claim 1, wherein diluted HF is used to remove the oxide layer.

12. The method of claim 1, wherein hot phosphoric acid is used to remove the nitride layer.

13. The method of claim 1, further comprising generating a concentration of nitrogen in the tunnel dielectric layer/silicon substrate interface, wherein the concentration of the nitrogen is at least 2% by atomic weight.

14. The method of claim 13, wherein the concentration of nitrogen is between 2% and 5% by atomic weight.

* * * * *